(12) United States Patent
Fujioka et al.

(10) Patent No.: US 7,730,232 B2
(45) Date of Patent: Jun. 1, 2010

(54) DATA TRANSFER METHOD AND SYSTEM

(75) Inventors: Shinya Fujioka, Kawasaki (JP); Kotoku Sato, Kawasaki (JP); Hitoshi Ikeda, Kawasaki (JP); Yoshiaki Okuyama, Kawasaki (JP); Jun Ohno, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 11/113,181

(22) Filed: Apr. 25, 2005

(65) Prior Publication Data

US 2005/0185493 A1 Aug. 25, 2005

Related U.S. Application Data

(63) Continuation of application No. PCT/JP03/08211, filed on Jun. 27, 2003.

(51) Int. Cl.
*G06F 13/00* (2006.01)
(52) U.S. Cl. .............................. 710/33; 710/20; 710/52; 710/62
(58) Field of Classification Search .................... 714/48, 714/719; 710/20, 33, 52, 62
See application file for complete search history.

(56) References Cited

U.S. PATENT DOCUMENTS 3,723,972 A * 3/1973 Chaddha .................... 370/300
5,612,834 A * 3/1997 Strang, Jr. ..................... 360/75
5,710,943 A * 1/1998 Burton et al. .................. 710/52
6,188,610 B1 2/2001 Kazuhiko et al.
6,229,866 B1 * 5/2001 Kim ............................. 375/377
6,865,701 B1 * 3/2005 Youngs et al. ............... 714/718
2002/0064079 A1 5/2002 Sato et al.
2002/0163848 A1* 11/2002 Grasso .................. 365/230.03
2003/0048659 A1 3/2003 Kanamori et al.

FOREIGN PATENT DOCUMENTS

| EP | 0 357 361 A2 | 3/1990 |
| EP | 0 760 513 A2 | 3/1997 |
| EP | 0898232 A2 * | 8/1999 |
| JP | 10-83345 A | 3/1998 |
| JP | 2003-85034 A | 3/2003 |

* cited by examiner

*Primary Examiner*—Tariq Hafiz
*Assistant Examiner*—Jasjit S Vidwan
(74) *Attorney, Agent, or Firm*—Arent Fox LLP

(57) ABSTRACT

A data transfer method and system are provided that prevent the length of a time required for writing to a flash memory from appearing on the surface as a system operation when the flash memory is used in place of an SRAM. The method of transferring data includes the steps of writing data from a controller to a volatile memory, placing the volatile memory in a transfer state, transferring the data from the volatile memory in the transfer state to a nonvolatile memory, and releasing the volatile memory from the transfer state in response to confirming completion of the transfer of the data.

12 Claims, 9 Drawing Sheets

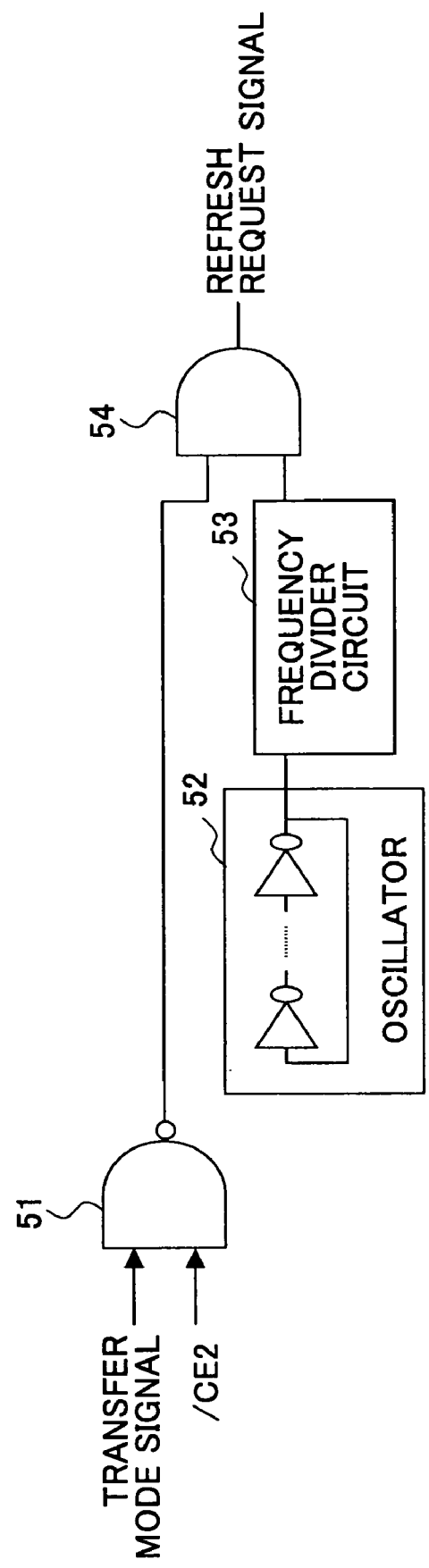

DATA TRANSFER METHOD AND SYSTEM

CROSS-REFERENCE TO RELATED APPLICATION

This is a continuation of International Application No. PCT/JP03/08211, filed on Jun. 27, 2003, the entire contents of which are hereby incorporated by reference.

BACKGROUND OF THE INVENTION

1. Field of the Invention

The present invention generally relates to data transfer methods and systems for use in information processing systems, and particularly relates to a data transfer method and system for use in an information processing system which employs a plurality of different types of memory devices.

2. Description of the Related Art

Together with a recent increase in the sophistication of service functions provided in the field of mobile communications such as cellular phones, the size of data being handled increases, resulting in a need for a larger memory volume. In mobile phones, for example, service functions are provided for moving picture data (movie functions), still images (camera functions), game functions, WEB access functions, etc. The required size of memory has significantly increased compared to the time when voice communication was the main mode of communication.

In mobile telephone equipment, SRAMs (Static Random Access Memory) were used as work memory in the days when voice communication was predominant. An SRAM is comprised of 6 transistors per memory cell, and, thus, the number of devices for storing 1-bit data is relatively large compared to a DRAM (Dynamic Random Access Memory), for example, resulting in difficulties in achieving a large memory capacity. Accordingly, it is extremely difficult to attain such highly sophisticated services as described above by use of a system employing only SRAMs.

Against this background, pseudo SRAMs (PSRAMs) have been developed that use a DRAM as a memory core but provide an SRAM-type interface. The pseudo SRAM can replace the SRAM while taking advantage of the accumulation of past technologies and assets, thereby making it possible to achieve highly sophisticated services by providing a memory system having a large storage capacity.

Many of the memory systems for mobile phones use three types of memories, i.e., an SRAM, a pseudo SRAM, and a flash memory. The flash memory is used to store programs and data. The SRAM is used to store data of relatively small size such as cache data while the power is on. The pseudo SRAM is used as work memory that is used at the time of moving picture processing or the like. Each of these memories is optimized according to its usage, and its replacement is regarded as a difficult challenge. The SRAM is characterized by its low standby current consumption and high-speed read/write access, but is not suitable for achieving a large memory capacity. The SRAM is also volatile. Accordingly, the SRAM is suited to store cache data of small size, but is not suited to store programs and data, which are required to be maintained after the power is off. The flash memory has low read/write access speed, but is characterized by its nonvolatile nature and large capacity as well as low standby current consumption. Accordingly, the flash memory is indispensable for use as storage for storing programs and data which need to be sustained after the power is off. The pseudo SRAM needs refresh operations, and its standby current consumption is large. The pseudo SRAM is also volatile. However, the pseudo SRAM has a large memory capacity and high read/write access speed. Accordingly, the pseudo SRAM is suitable for use as a work memory.

The use of a plurality of memory devices in a single system gives rise to a problem of a cost increase, which results from an increase in the number of memory components inside the mobile telephone equipment. Further, the technology for grinding chips for the purpose of sealing these memories in a single package needs to be developed, and the technology for achieving an MCP (multi-chip package) needs to be developed. These are the issues that need to be addressed.

In order to obviate the problems described above, the number of types of memories used in a system needs to be reduced. In the following, problems that arise when one of the three types of memory devices is replaced with one of the remaining two memory devices will be examined.

1) Flash Memory->SRAM: insufficient capacity, data loss upon power-off
2) Flash Memory->pseudo SRAM: data loss upon power-off, large current consumption
3) SRAM->Flash Memory: lengthy write time
4) SRAM->pseudo SRAM: large current consumption
5) pseudo SRAM->Flash Memory: lengthy write time
6) pseudo SRAM->SRAM: insufficient capacity It is difficult to overcome the problem of insufficient capacity with respect to 1) and 6). The option 2) is not viable since data is lost upon power-off. These three options are thus not possible in consideration of the mobile phone specifications and systems of the present day. It thus turns out that the flash memory is indispensable. In consideration of the issue of a write time with respect to 5), it can be said that the pseudo SRAM is also an indispensable memory device. Accordingly, the issue at hand is whether the SRAM can be replaced with another memory.

With respect to 4), the pseudo SRAM has a problem of large current consumption although some pseudo SRAMs have been developed that achieve a standby current compatible to that of the SRAM by use of such functions as a power-down mode and a partial refresh mode. Accordingly, it is preferable to replace the SRAM with the flash memory as in 3) than replacing the SRAM with the pseudo SRAM as in 4). In this case, however, there is a need to solve the problem of a lengthy write time.

Accordingly, there is a need for a data transfer method and system that prevents the length of a time required for writing to the flash memory from appearing on the surface as a system operation when the flash memory is used in place of the SRAM.

SUMMARY OF THE INVENTION

It is a general object of the present invention to provide a data transfer method and system that substantially obviate one or more problems of the related art described above.

It is another and more specific object of the present invention to provided a data transfer method and system that prevents the length of a time required for writing to a flash memory from appearing on the surface as a system operation when the flash memory is used in place of an SRAM.

A method of transferring data according to the present invention includes the steps of writing data from a controller to a volatile memory, placing the volatile memory in a transfer state, transferring the data from the volatile memory in the transfer state to a nonvolatile memory, and releasing the volatile memory from the transfer state in response to confirming completion of the transfer of the data.

Further, a system for transferring data according to the present invention includes a volatile memory, a nonvolatile memory, and a controller configured to place the volatile memory in a transfer state after writing data to the volatile memory, to transfer the data from the volatile memory in the transfer state to the nonvolatile memory, and to release the volatile memory from the transfer state in response to confirming completion of the transfer of the data.

In the data transfer method and system described above, when cache data of the controller is transferred to the nonvolatile memory such as a flash memory, the volatile memory such as a pseudo SRAM is used as a temporary buffer so as to avoid the situation in which the controller is bound for a long time period corresponding to the writing of data to the nonvolatile memory. Further, the use of the data register of the volatile memory as a temporary buffer and the suspension of a refresh operation to place the memory core in an inactive state make it possible to keep the current consumption in the volatile memory to a minimum during the data transfer period.

BRIEF DESCRIPTION OF THE DRAWINGS

Other objects and further features of the present invention will be apparent from the following detailed description when read in conjunction with the accompanying drawings, in which:

FIG. 7 is a drawing showing an example of the configuration of a refresh request signal generating circuit of the pseudo SRAM;

DESCRIPTION OF THE PREFERRED EMBODIMENTS

In the following, embodiments of the present invention will be described with reference to the accompanying drawings.

Figure 1:
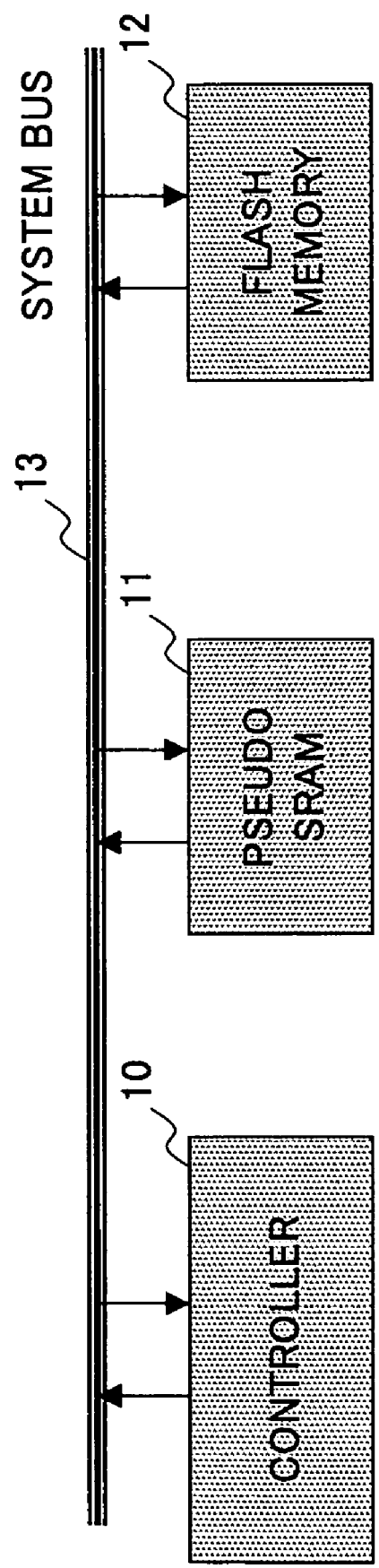
FIG. 1 is a block diagram showing the configuration of an information processing system to which the present invention is applied.

FIG. 1 is a block diagram showing the configuration of an information processing system according to the present invention.

The information processing system of FIG. 1 is a memory system used in a mobile phone, for example, and includes a controller 10, a pseudo SRAM 11, a flash memory 12, and a system bus 13. The flash memory 12 is used to store therein programs to be executed and data to be processed by the controller 10. The pseudo SRAM 11 is used as a work memory area that is used at the time of moving picture processing or the like by the controller 10. Here, a memory serving as the work memory area suffices if it is a large size RAM, and is not limited to the pseudo SRAM. For example, a DRAM (Dynamic Random Access Memory), SDRAM (Synchronous Dynamic Random Access Memory), FRAM (Ferroelectric Random Access Memory), or the like may accomplish the same function in place of the pseudo SRAM 11 shown in FIG. 1.

The information processing system shown in FIG. 1 does not use an SRAM that was used in the related-art system for the purpose of storing data of relatively small size such as cache data. In the present invention, the function of such SRAM is taken over by the flash memory 12.

In the configuration in which the flash memory 12 stores cache data, a problem arises in that the write speed of the flash memory 12 is slow when transferring data from the controller 10 to the flash memory 12. Until the writing to the flash memory 12 is completed, the controller 10 needs to keep the contents of the internal cache, thus incapable of moving on to a next operation for a long time.

In the present invention, an internal register of the pseudo SRAM 11 is utilized as a place where the controller 10 stores transfer data in addition to the cache. First, the transfer data is stored in the internal register of the pseudo SRAM 11. Then, the data is transferred from the internal register of the pseudo SRAM 11 to the flash memory 12. A transfer status indicative of whether the transfer was successfully completed is checked so as to ensure reliable data transfer.

Figure 2:
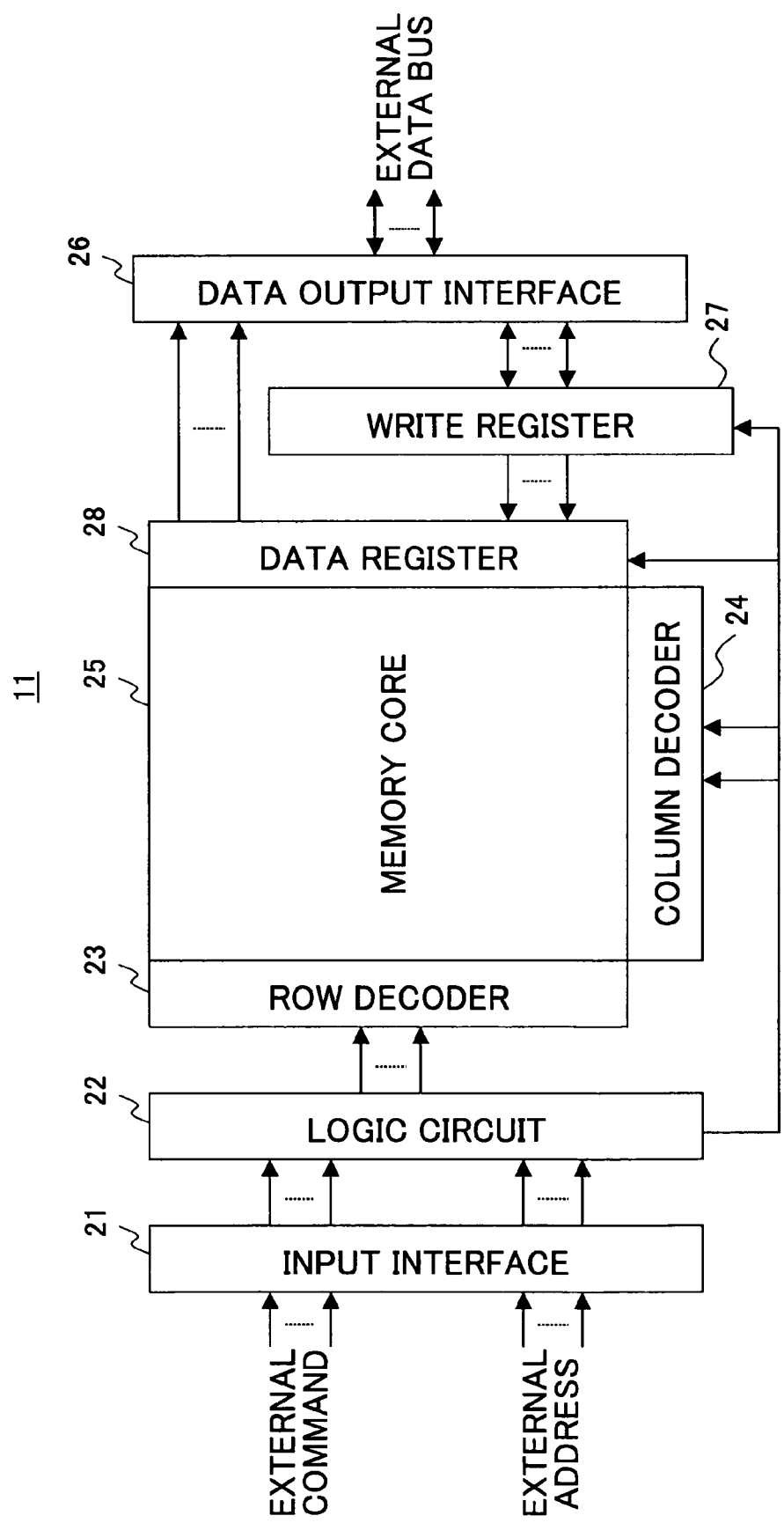
FIG. 2 is a block diagram showing the configuration of a pseudo SRAM.

FIG. 2 is a block diagram showing the configuration of the pseudo SRAM 11.

The pseudo SRAM 11 includes an input interface 21, a logic circuit 22, a row decoder 23, a column decoder 24, a memory core 25, a data input/output interface 26, a write register 27, and a data register 28.

The input interface 21 receives a command signal and an address signal from an exterior, and supplies them to the logic circuit 22. The logic circuit 22 decodes the received command, and controls each part of the pseudo SRAM 11 according to the decoded results. The logic circuit 22 supplies a row address of the received address signal to the row decoder 23, and supplies a column address to the column decoder 24.

The row decoder 23 decodes the row address, and activates a word line corresponding to the word indicted by the decoded address. Data of the memory cells connected to the selectively activated word line are supplied to sense amplifiers through bit lines. The word lines, bit lines, and sense amplifiers are provided in the memory core 25. The column decoder 24 decodes the column address, and activates a column selecting line corresponding to the column specified by the decoded address. The sense amplifiers corresponding to the selectively activated column selecting line are coupled to the data register 28.

The data register 28 supplies the retrieved data to the data input/output interface 26. The data input/output interface 26 supplies the retrieved data to the exterior of the pseudo SRAM 11 at the time of read operation, and receives write data from the exterior at the time of write operation. The data input/output interface 26 supplies the write data to the data register 28 through the write register 27. The write data stored in the data register 28 is then written to the memory cells corresponding to the selected word via the sense amplifiers, bit lines, etc., of the memory core 25.

Figure 3:
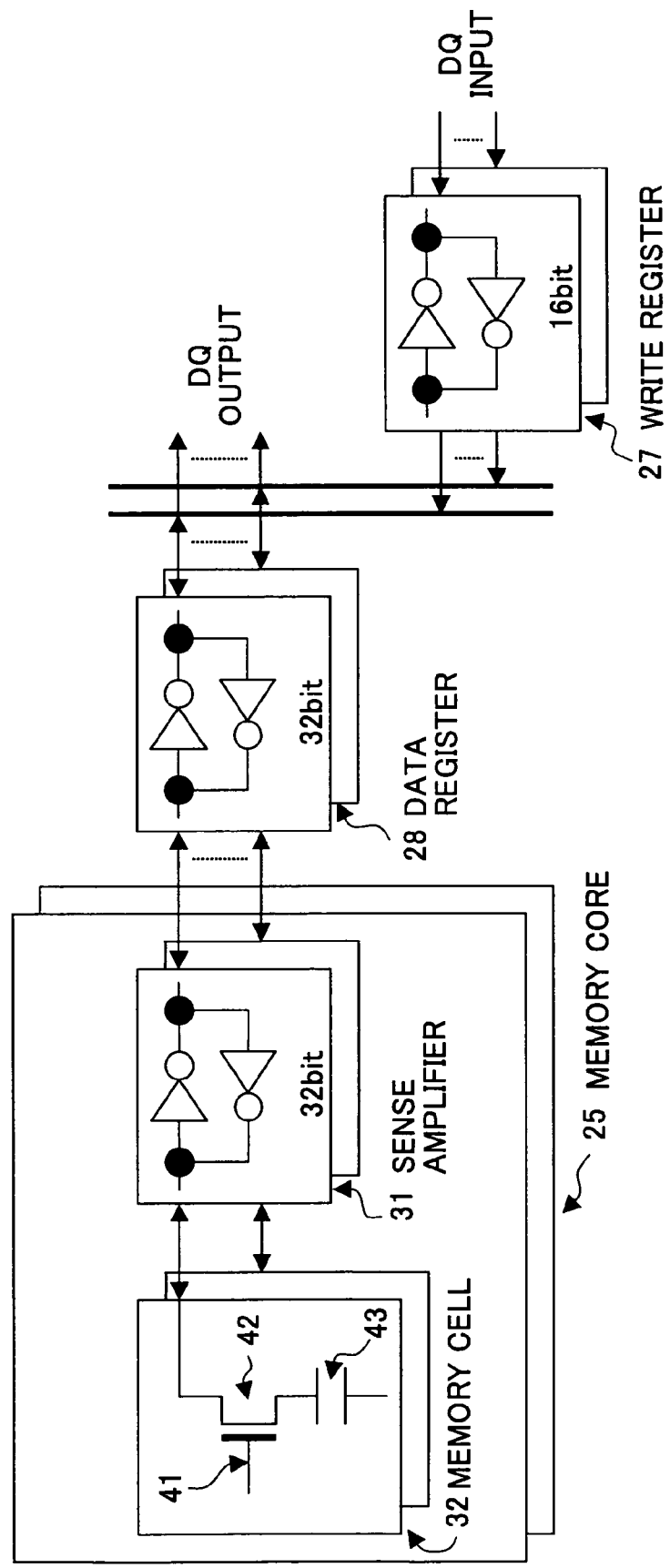
FIG. 3 is a drawing for explaining relationships between a memory core, write register, and data register of the pseudo SRAM.

FIG. 3 is a drawing for explaining the relationships between the memory core 25, the write register 27, and the data register 28 of the pseudo SRAM 11.

As shown in FIG. 3, the pseudo SRAM 11 includes the 16-bit write register 27 corresponding to one word, and also includes the 32-bit data register 28 corresponding to two words. Data that the pseudo SRAM 11 exchanges with the system bus 13 (FIG. 1) at a time is 16 bits whereas data that the memory core 25 exchanges with the data register 28 at a time is 32 bits. This 32-bit data is supplied to memory cells 32 via a 32-bit sense amplifier 31 in the case of a write operation, for example. In the memory cells 32, transistors 42 connected to a selectively activated word line 41 are made conductive, so that electric charge responsive to the write data is stored in capacitors 43.

In such a configuration, a single access operation with respect to the memory core 25 is sufficient while data input/output between the pseudo SRAM 11 and the system bus 13 is performed twice. Accordingly, the external data transfer can have a cycle faster than the cycle for the internal core operation. In the example of FIG. 3, the data register 28 is comprised of 32 bits. Alternatively, a 64-bit configuration may be used, so that four words are exchanged with the exterior by taking four cycles each for one word. In the present invention, the number of words in the data register 28 is not limited to a particular number.

Figure 4:
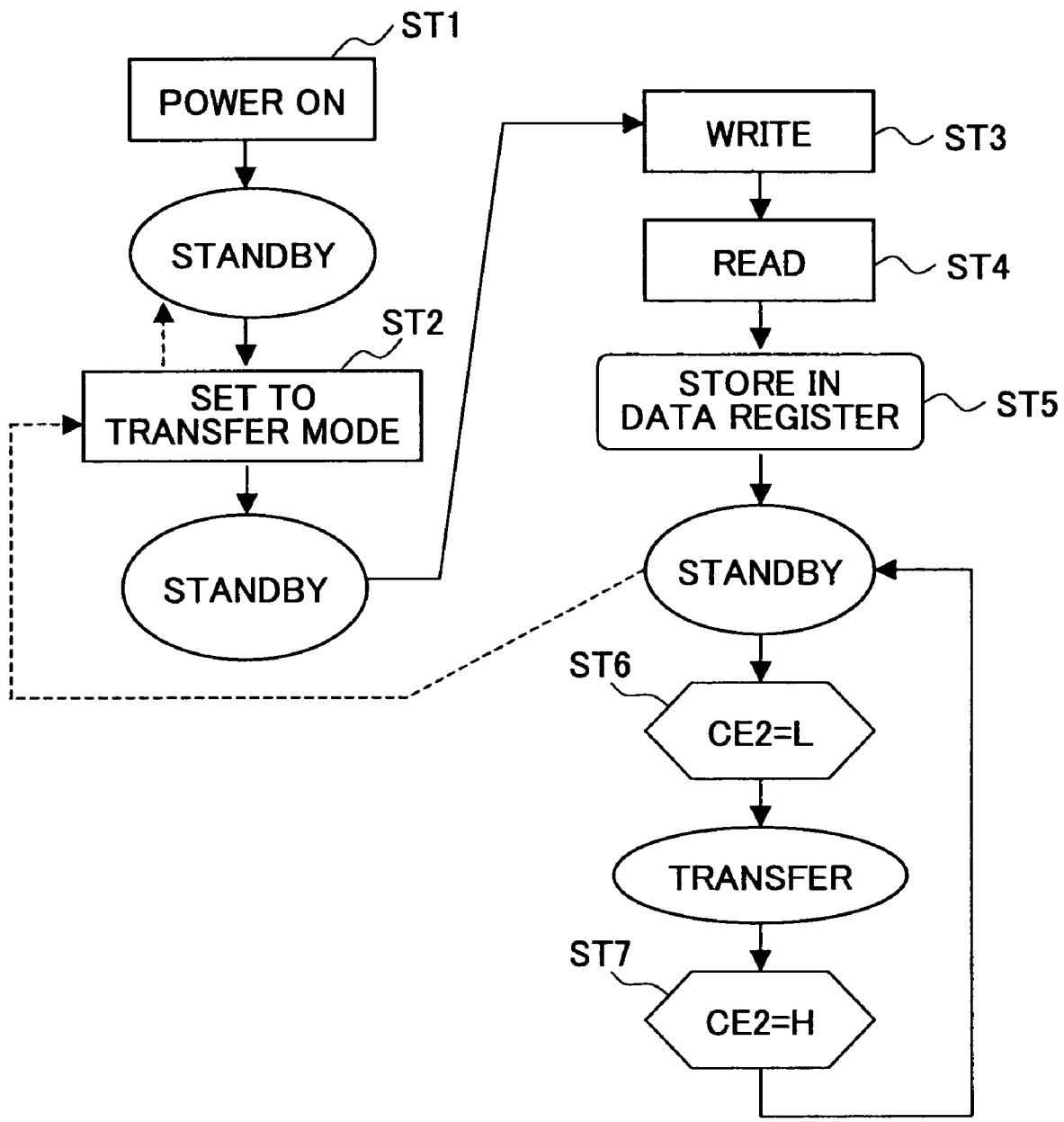
FIG. 4 is a flowchart showing a data transfer operation according to the present invention.

FIG. 4 is a flowchart showing a data transfer operation according to the present invention.

At step ST1 of FIG. 4, power is turned on, resulting in a standby state. At step ST2, the controller 10 asserts a transfer mode signal, thereby setting the pseudo SRAM 11 in a transfer preparation mode. In a normal operation mode other than the transfer preparation mode, the pseudo SRAM 11 is placed in the unselected state in response to a drop to LOW of a chip-enable signal CE2. After being set in the transfer preparation mode, however, the LOW level of the chip-enable signal CE2 initiates an operation of transferring data from the pseudo SRAM 11 to the flash memory 12. After step ST2, the pseudo SRAM 11 is placed in standby state.

At step ST3, the controller 10 writes cache data to the pseudo SRAM 11, and also stores flag information in the write register 27 of the pseudo SRAM 11. At the time of writing this cache data, the controller 10 transfers two words of cache data to the pseudo SRAM 11 by performing one-word transfer twice, so that the two words are stored in the memory core 25. If the data register 28 of the pseudo SRAM 11 is comprised of four words, for example, one-word transfer is performed four times, so that four words are stored in the memory core 25. The flag information noted above serves to store a value (e.g., "0") indicative of the uncompleted status of the data transfer operation in the data register 28.

At step ST4, the controller 10 supplies a read command to the pseudo SRAM 11. At step ST5, the pseudo SRAM 11 performs a read operation, and transfers the data of two words stored in the memory core 25 to the data register 28. Namely, the reading of data from the same address of the pseudo SRAM 11 as the write address provides for the write data written at step ST3 to be stored in the data register 28. In order to hide the time required for writing to the flash memory 12, there is a need to store a large number of data in the data register 28. In consideration of this, one-word write operation is performed multiple times as was described in step ST3, thereby storing the data comprised of multiple words in the data register 28. After step ST5, the standby mode is activated.

Thereafter, at step ST6, the controller 10 supplies to the pseudo SRAM 11 a command for performing data transfer by use of the pseudo SRAM 11 as a temporary area. To be specific, the chip-enable CE2 of the pseudo SRAM 11 is set to LOW. With this, the pseudo SRAM 11 is placed in the transfer processing mode. In the transfer processing mode, the pseudo SRAM 11 does not function as a memory for storing another data, and lapses into an inactive state by suspending even refresh operations. Since the refresh operations are suspended, the current consumption in the pseudo SRAM 11 is extremely low during this time period. With the pseudo SRAM 11 in this state, the controller 10 reads the data from the data register 28 of the pseudo SRAM 11, and supplies a write command to the flash memory 12, thereby transferring the data read from the pseudo SRAM 11 to the flash memory 12 via the system bus 13. When the controller 10 confirms that the transfer of the data from the data register 28 of the pseudo SRAM 11 to the flash memory 12 was successfully completed, the controller 10 rewrites the flag information stored in the write register 27 of the pseudo SRAM 11 such that the new value (e.g., "1") indicates the completion of the data transfer operation. With this, the transfer operation comes to an end.

At step ST7, the controller 10 finishes the mode by which data is transferred by using the pseudo SRAM 11 as a temporary area. To be specific, the chip-enable CE2 of the pseudo SRAM 11 is changed to HIGH. With this, the pseudo SRAM 11 is placed in the standby condition.

In this manner, when the cache data of the controller 10 is transferred to the flash memory 12, the pseudo SRAM 11 is used as a temporary buffer so as to avoid the situation in which the controller 10 is bound for a long time period corresponding to the writing of data to the flash memory 12. Further, the use of the data register 28 of the pseudo SRAM 11 as a temporary buffer and the suspension of the refresh operation to place the memory core 25 in an inactive state make it possible to keep the current consumption in the pseudo SRAM 11 to a minimum during the data transfer period.

Figure 5:
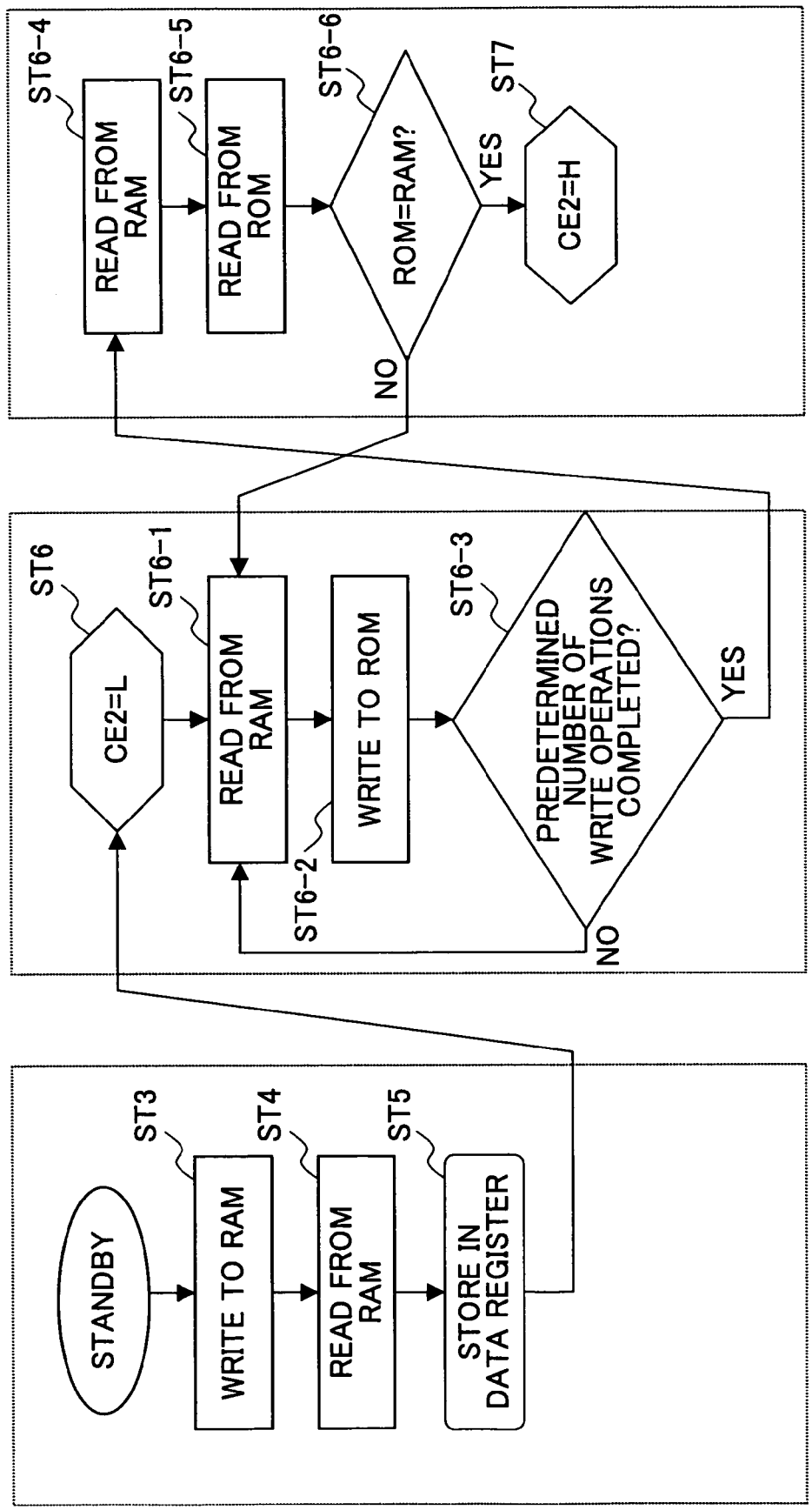
FIG. 5 is a flowchart showing a detail of transfer process.

FIG. 5 is a flowchart showing the transfer process described above.

Steps ST3 through ST6 of FIG. 5 are the same as steps ST3 through ST6 of FIG. 4. After step ST6, at step ST6-1, the controller 10 reads one word's worth of data from the data register 28 of the pseudo SRAM 11. At step ST6-2, the controller 10 supplies a write command to the flash memory 12, thereby writing to the flash memory 12 the one word's worth of data read from the pseudo SRAM 11 to the system bus 13.

At step ST6-3, the controller 10 checks whether a predetermined number of write operations with respect to the flash memory 12 have been completed. If the number of words of the transfer data stored in the data register 28 is n, data read operations from the pseudo SRAM 11 and data write operations to the flash memory 12 need to be performed n times in order to complete the predetermined number of write operations with respect to the flash memory 12. If the predetermined number of write operations are not completed, the procedure returns to step ST6-1. When all the words stored in the data register 28 are transferred to the flash memory 12 through the predetermined number of data write operations, the procedure proceeds to step ST6-4.

At step ST6-4, the controller 10 reads the data from the data register 28 of the pseudo SRAM 11. At step ST6-5, the controller 10 reads the corresponding data from the flash memory 12. At step ST6-6, the controller 10 checks whether the data read from these two memories match. To be specific, the read operation and match checking operation described here are successively performed separately for each word. If the data do not match, it is ascertained that the writing is not properly completed, so that the procedure returns to step ST6-1 to perform the write operation again. If the data match, at step ST7, the controller 10 finishes the mode that transfers data by use of the pseudo SRAM 11 as a temporary area. In doing so, the controller 10 rewrites the flag information stored in the write register 27 of the pseudo SRAM 11 such that the new value (e.g., "1") indicates the completion of the data transfer operation. This flag information is used when the power is switched off during the data transfer operation, for example, thereby making it possible to check whether the data transfer was successfully completed after the system operation is resumed.

Figure 6:
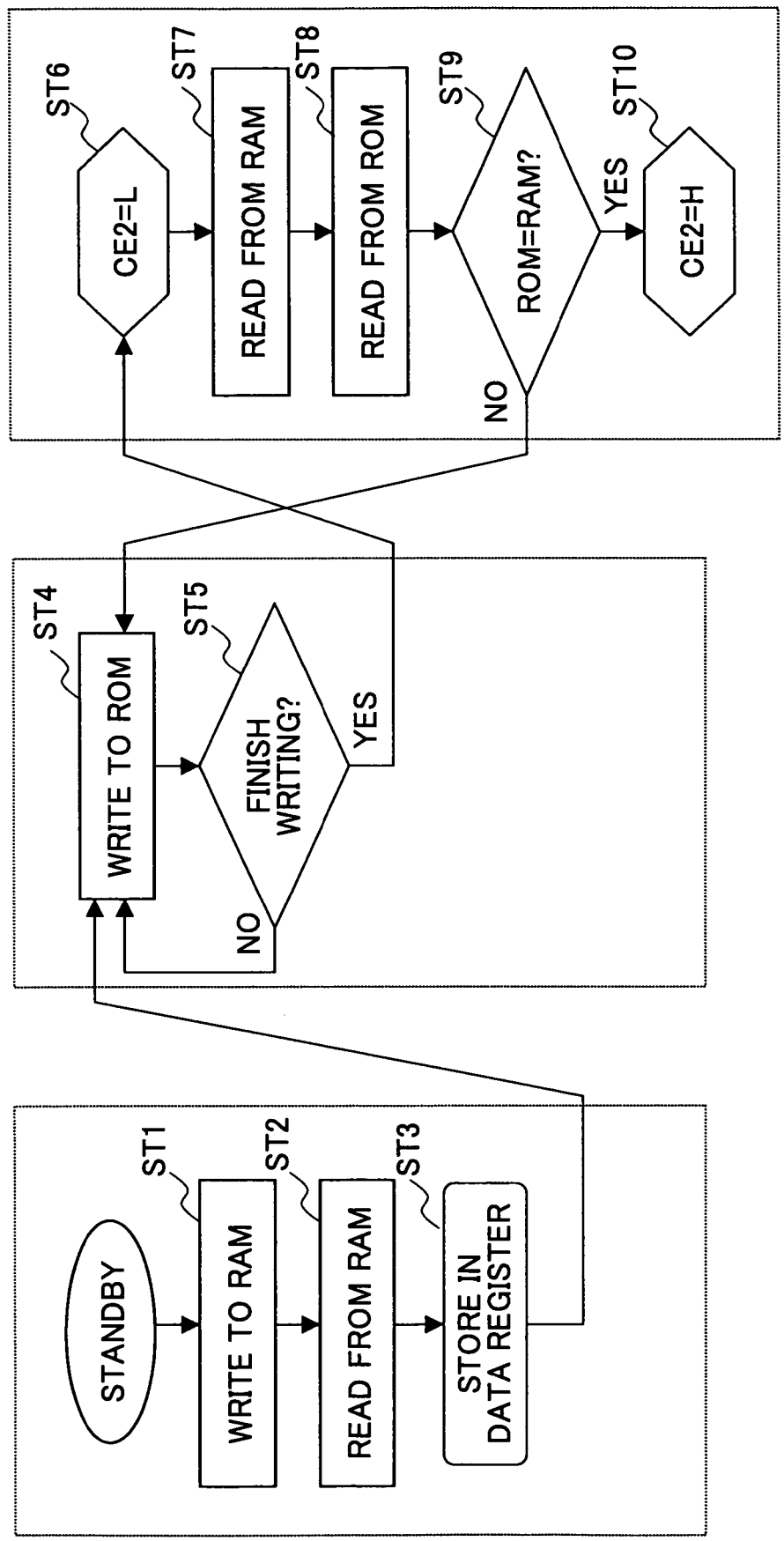
FIG. 6 is a flowchart showing another embodiment of the transfer process according to the present invention.

FIG. 6 is a flowchart showing another embodiment of the transfer process according to the present invention.

At step ST1 in FIG. 6, the controller 10 writes cache data to the pseudo SRAM 11, and also stores flag information in the write register 27 of the pseudo SRAM 11. When writing this cache data, the controller 10 transfers the two words worth of cache data to the pseudo SRAM 11 by performing a one-word transfer twice, so that the two words are stored in the memory core 25. Further, the flag information noted above serves to store in the data register 28 a value (e.g., "0") indicative of the uncompleted status of the data transfer operation.

At step ST2, the controller 10 supplies a read command to the pseudo SRAM 11. At step ST3, the pseudo SRAM 11 performs a read operation, thereby transferring the two word data stored in the memory core 25 to the data register 28.

At step ST4, the controller 10 writes the cache data to the flash memory 12. In so doing, the controller 10 does not write the transfer data of the data register 28 of the pseudo SRAM 11 to the flash memory 12, but writes the cache data directly from the controller 10 to the flash memory 12. As the flash memory 12, there is such a type of model that an internal register has a sufficient capacity for storing write data supplied from an exterior. At step ST4, such internal register of the flash memory 12 is utilized so that all the cache data of the controller 10 is first stored in the internal register of the flash memory 12. Thereafter, a write operation is performed inside the flash memory 12 so that the contents of this register are written to the flash memory core.

At step ST5, the controller 10 checks whether the write operation of the flash memory 12 is completed. If completed, the procedure proceeds to step ST6.

At step ST6, the controller 10 changes the chip-enable CE2 of the pseudo SRAM 11 to LOW. In response, the pseudo SRAM 11 enters into a transfer mode. At step ST7, the controller 10 reads the data from the data register 28 of the pseudo SRAM 11. At step ST8, the controller 10 reads the corresponding data from the flash memory 12. At step ST9, the controller 10 checks whether the data read from these two memories match. To be specific, the read operation and match checking operation described here are successively performed separately for each word. If the data do not match, it is ascertained that the writing is not properly completed, so that the procedure returns to step ST4 to perform the operation for writing data from the internal register of the flash memory 12 to the flash memory core. If the data match, at step ST10, the chip-enable signal CE2 is changed to HIGH. In so doing, the controller 10 rewrites the flag information stored in the write register 27 of the pseudo SRAM 11 such that the new value (e.g., "1") indicates the completion of the data transfer operation.

As described above, an internal register having the sufficient capacity to store the write data supplied from the exterior may be provided in the flash memory 12. In such a case, this register may be utilized to perform the data transfer.

FIG. 7 is a drawing showing an example of the configuration of a refresh request signal generating circuit of the pseudo SRAM 11.

The refresh request signal generating circuit of FIG. 7 includes a NAND gate 51, an oscillator 52, a frequency divider circuit 53, and an AND gate 54. The NAND gate 51 receives a transfer mode signal and an inverse /CE2 of the chip-enable signal CE2 from the controller 10. The transfer mode signal is asserted at step ST2 in the procedure shown in FIG. 4.

With the transfer mode signal being asserted at HIGH, the chip-enable signal CE2 changes to LOW as shown at step ST6 of FIG. 4, resulting in the output of the NAND gate 51 being changed to LOW, thereby closing the gate of the AND gate 54. The oscillator 52 oscillates at predetermined frequency, and the frequency divider circuit 53 divides the frequency of the oscillating signal so as to generate a periodic pulse signal. When the gate of the AND gate 54 is closed, the periodic pulse signal from the frequency divider circuit 53 does not pass through the AND gate 54, thereby not being supplied to a refresh circuit as a refresh request signal. Accordingly, the refresh operation of the pseudo SRAM 11 is suspended.

When the transfer mode signal is not asserted, the output of the NAND gate 51 is HIGH regardless of the level of the chip-enable signal CE2. The refresh request signal thus continues to be supplied to the refresh circuit.

Figure 8A:
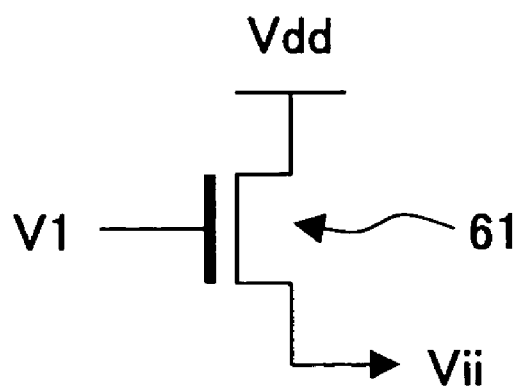
FIG. 8A is a diagram showing a typical configuration of a stepped-down potential generating circuit that generates an internal stepped-down potential in the pseudo SRAM.

FIG. 8A is a diagram showing a typical configuration of the stepped-down potential generating circuit that generates an internal stepped-down potential Vii in the pseudo SRAM 11.

The stepped-down potential generating circuit shown in FIG. 8A includes an NMOS transistor 61 that receives a predetermined gate voltage V1 applied to its gate. The drain node is coupled to an external power supply voltage Vdd, and the source node supplies the internal stepped-down potential Vii. When the stepped-down potential Vii drops due to the current consumption by the internal circuit, a difference between the gate potential V1 and the source potential (stepped-down potential Vii) widens, resulting in an increase in the current flowing through the NMOS transistor 61. This serves to raise the stepped-down potential Vii. With this provision, the stepped-down potential Vii is controlled to be a constant potential that is determined by the gate potential 1.

Figure 8B:
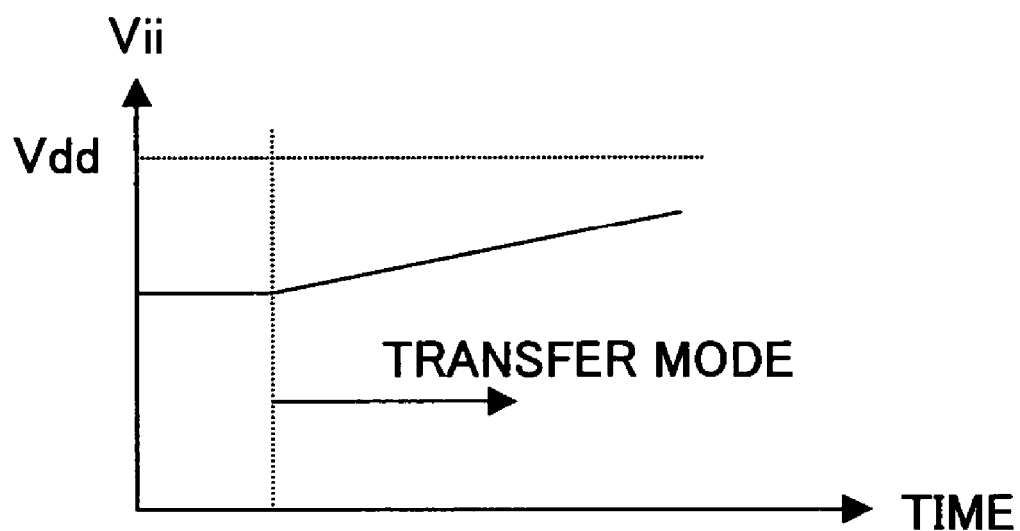
FIG. 8B is a diagram showing a change in the stepped-down potential after the pseudo SRAM enters into a transfer mode.

FIG. 8B is a diagram showing a change in the stepped-down potential after the pseudo SRAM 11 enters into the transfer mode. As shown in FIG. 8B, when the pseudo SRAM 11 is set in the transfer mode, the stepped-down potential Vii generated by the stepped-down potential generating circuit shown in FIG. 8A gradually rises to approach the external voltage Vdd. This is because the setting of the pseudo SRAM 11 in the transfer mode results in the refresh operation being suspended, so that the consumption of the stepped-down voltage Vii by the internal circuit stops. If the stepped-down potential Vii rises in this manner, an expected error may occur when the pseudo SRAM 11 resumes its normal operation after exiting from the transfer mode.

Figure 9A:
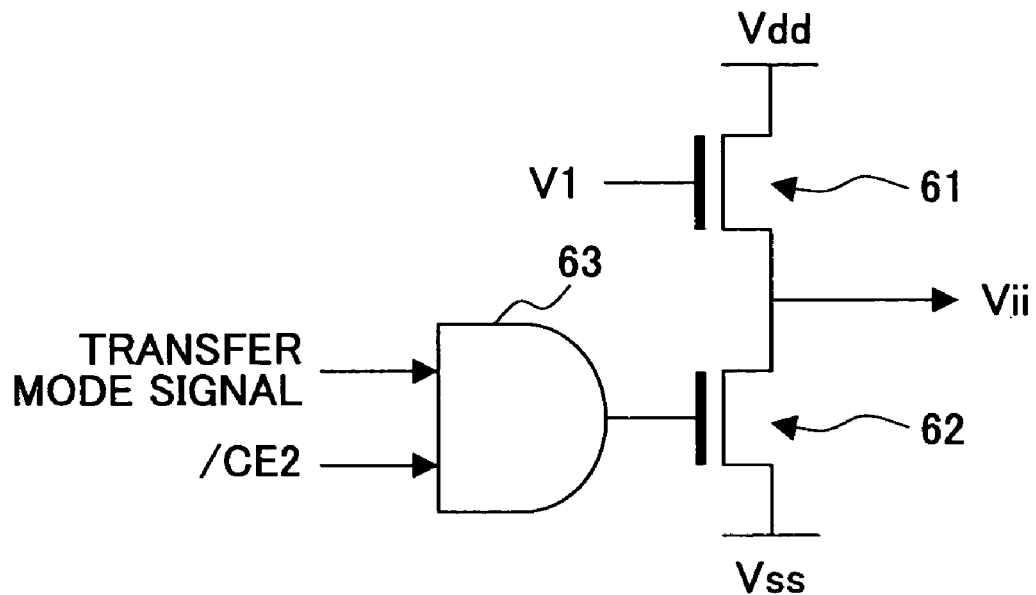
FIG. 9A is a diagram showing a configuration of the stepped-down potential generating circuit according to the present invention.

FIG. 9A is a diagram showing a configuration of the stepped-down potential generating circuit according to the present invention.

The stepped-down potential generating circuit of FIG. 9A includes an NMOS transistor 62 connected in series with the NMOS transistor 61 shown in FIG. 8A, with its gate receiving the output of an AND gate 63. The AND gate 63 receives the transfer mode signal and an inverse /CE2 of the chip-enable signal CE2 from the controller 10. The transfer mode signal is asserted at step ST2 in the procedure shown in FIG. 4.

With the transfer mode signal being asserted at HIGH, the chip-enable signal CE2 changes to LOW as shown at step ST6 of FIG. 4, resulting in the pseudo SRAM 11 entering into the transfer mode. At this time, the output of the AND gate 63 becomes HIGH, so that the NMOS transistor 62 becomes conductive to allow the passage of an electric current, which consumes the current of the stepped-down voltage Vii.

Figure 9B:
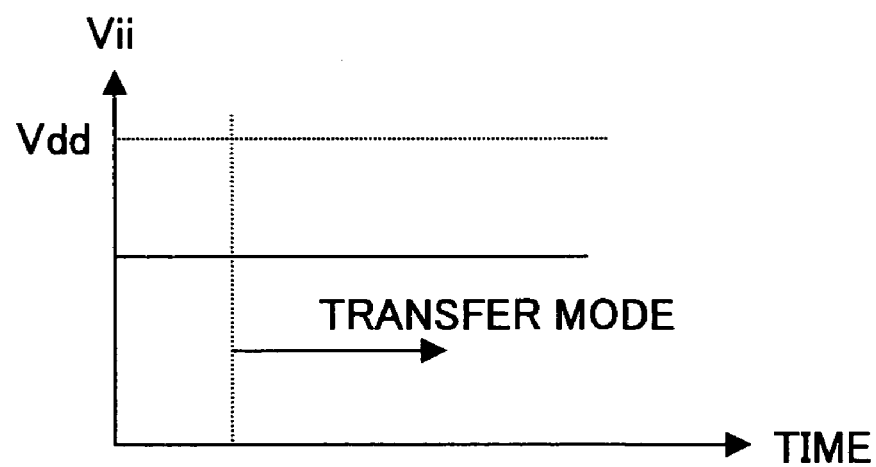
FIG. 9B is a diagram showing a change in the stepped-down potential after the pseudo SRAM enters into the transfer mode.

FIG. 9B is a diagram showing a change in the stepped-down potential after the pseudo SRAM 11 enters into the transfer mode. As shown in FIG. 9B, even when the pseudo SRAM 11 is set in the transfer mode, the stepped-down potential Vii stays at a predetermined potential defined by the potential V1 since the current of the stepped-down voltage Vii is consumed as described above. This successfully avoids an unexpected error and the like occurring due to an increase in the stepped-down voltage Vii.

The use of the data transfer method as described above provides for the system configuration to dispose of SRAMs. As a result, the number of memory components can be decreased to achieve cost reduction. Further, the number of memory devices is decreased in the MCP structure containing a plurality of memory devices, thereby contributing to the thinning of the package, which makes the mobile phone device thinner. When a large number of memories are contained in the same package, the layout of interconnect wires inside the package tend to become complex. The present invention suppresses an increase in the complexity of the wire layout, thereby making the manufacturing of the device easier.

Although the present invention has been described with reference to embodiments, the present invention is not limited to these embodiments. Various variations and modifications may be made without departing from the scope of the claimed invention.

What is claimed is:

1. A method of writing data from a controller to a nonvolatile memory, comprising the steps of:
   writing data from the controller to a volatile memory having a data register and a memory core so that the data is stored in the memory core;
   reading the data from the memory core to the data register while a refresh operation of the memory core is not suspended;
   placing the volatile memory in a transfer state in which refresh operation of the memory core is not performed to place the memory core in an inactive state where the memory core does not function as a memory for storing data after reading the data from the memory core to the data register;
   transferring the data from the data register of the volatile memory in the transfer state to a nonvolatile memory; and
   releasing the volatile memory from the transfer state in response to confirming completion of the transfer of the data,
   wherein said step of releasing the volatile memory from the transfer state includes:
   reading the data from the volatile memory as first data;
   reading the data from the nonvolatile memory as second data; and
   releasing the volatile memory from the transfer state in response to finding that the first data matches the second data.

2. The method as claimed in claim 1, wherein the volatile memory is configured to suspend a refresh operation in the transfer state.

3. The method as claimed in claim 1, further comprising:
   writing a flag from the controller to the volatile memory; and
   rewriting a value of the flag in response to confirming completion of the transfer of the data.

4. The method as claimed in claim 1, wherein the controller, the volatile memory, and the nonvolatile memory are respective, separate chips.

5. A method of writing data from a controller to a nonvolatile memory, comprising the steps of:
   writing data from the controller to a volatile memory having a data register and a memory core so that the data is stored in the memory core;
   reading the data from the memory core to the data register while a refresh operation of the memory core is not suspended;
   writing the data from the controller to a nonvolatile memory;
   placing the volatile memory in a transfer state in which refresh operation of the memory core is not performed to place the memory core in an inactive state where the memory core does not function as a memory for storing data after reading the data from the memory core to the data register;
   reading the data from the data register of the volatile memory in the transfer state as first data;
   reading the data from the nonvolatile memory as second data; and
   releasing the volatile memory from the transfer state in response to finding that the first data matches the second data.

6. The system for transferring data as claimed in claim 5, wherein said controller is further configured to write a flag to the volatile memory and to rewrite a value of the flag in response to confirming completion of the transfer of the data.

7. The method as claimed in claim 1, wherein the volatile memory is placed in the transfer state by inactivating a chip enable signal.

8. The method as claimed in claim 1, further comprising:
   writing data from a system bus to a write register; and
   writing the data to the data register from the write register.

9. The method as claimed in claim 8, wherein the write register is an n-bit register and the data register is an m-bit register, wherein m is an integral multiple of n.

10. The system as claimed in claim 5, wherein the volatile memory is placed in the transfer state by inactivating a chip enable signal.

11. The system as claimed in claim 5, wherein the volatile memory includes a write register that receives data from a system bus and transfers the data to the data register.

12. The system as claimed in claim 11, wherein the write register is an n-bit register and the data register is m-bit register, wherein m is integral multiple of n.

* * * * *